(12) United States Patent
Todorokihara (10) Patent No.: US 10,560,101 B2
(45) Date of Patent: Feb. 11, 2020

(54) COUNT VALUE GENERATION CIRCUIT, PHYSICAL QUANTITY SENSOR MODULE, AND STRUCTURE MONITORING DEVICE

(71) Applicant: Seiko Epson Corporation, Tokyo (JP)

(72) Inventor: Masayoshi Todorokihara, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/395,366

(22) Filed: Apr. 26, 2019

(65) Prior Publication Data

US 2019/0334528 A1 Oct. 31, 2019

(30) Foreign Application Priority Data

Apr. 27, 2018 (JP) .................... 2018-086186

(51) Int. Cl.
| | |
|---|---|
| *H03K 19/177* | (2006.01) |
| *H03K 19/17704* | (2020.01) |
| *H03K 19/17736* | (2020.01) |
| *G01R 23/02* | (2006.01) |
| *G01R 31/317* | (2006.01) |
| *H03K 21/40* | (2006.01) |

(52) U.S. Cl.
CPC ....... *H03K 19/17716* (2013.01); *G01R 23/02* (2013.01); *G01R 31/31727* (2013.01); *H03K 19/1774* (2013.01); *H03K 21/406* (2013.01)

(58) Field of Classification Search
None
See application file for complete search history.

(56) References Cited

U.S. PATENT DOCUMENTS

| 10,305,499 B2* | 5/2019 | Todorokihara ......... H03K 19/21 |
|---|---|---|
| 2011/0301895 A1* | 12/2011 | Miyahara ............... G01R 25/00 |
| | | 702/72 |
| 2015/0333765 A1 | 11/2015 | Todorokihara |

FOREIGN PATENT DOCUMENTS

| JP | 2015-220552 A | 12/2015 |
|---|---|---|
| JP | 2018-100856 A | 6/2018 |
| JP | 2018-163030 A | 10/2018 |

* cited by examiner

*Primary Examiner* — Cassandra F Cox
(74) *Attorney, Agent, or Firm* — Harness, Dickey & Pierce, P.L.C.

(57) ABSTRACT

A count value generation circuit includes a first counter that counts edges of a reference signal to generate a first count value in synchronization with an input signal, a time digital value generator that generates a time digital value corresponding to a phase difference between the reference signal and the input signal, a count integrated value combiner that outputs a difference between an integer multiple of the first count value and the time digital value, and a count value generator that generates a count value based on a difference between a first output value and a second output value output from the count integrated value combiner.

7 Claims, 9 Drawing Sheets

COUNT VALUE GENERATION CIRCUIT, PHYSICAL QUANTITY SENSOR MODULE, AND STRUCTURE MONITORING DEVICE

The present application is based on and claims priority from JP Application Serial Number 2018-086186, filed Apr. 27, 2018, the disclosure of which is hereby incorporated by reference herein in its entirety.

BACKGROUND

1. Technical Field

The present disclosure relates to a count value generation circuit, a physical quantity sensor module, and a structure monitoring device.

2. Related Art

In JP-A-2015-220552, a frequency counter for performing frequency delta sigma modulation on a signal to be measured using a plurality of frequency delta sigma modulators (FDSM) configured to be arranged in parallel and outputting a frequency delta sigma modulation signal with dispersed idle tones is described. This frequency delta sigma modulation signal is a signal corresponding to a ratio between a frequency of a reference signal (reference clock) and a frequency of a signal to be measured.

However, as described in JP-A-2015-220552, since a count type frequency counter using a plurality of FDSMs coupled in parallel uses a plurality of signals having different phases as operation clocks, a clock skew becomes large and it is difficult to improve accuracy of a count value.

SUMMARY

A count value generation circuit according to an aspect of the present disclosure includes a first counter that counts edges of a reference signal to generate a first count value in synchronization with an input signal, a time digital value generator that generates a time digital value corresponding to a phase difference between the reference signal and the input signal, a count integrated value combiner that outputs a difference between an integer multiple of the first count value and the time digital value, and a count value generator that generates a count value based on a difference between a first output value and a second output value output from the count integrated value combiner.

In the count value generation circuit according to the aspect of the present disclosure, the time digital value generator may include an oscillator, a second counter that counts an output signal from the oscillator based on the reference signal and generates a second count value, and a count value integrator that integrates the second count value to obtain an integrated value and outputs the integrated value as the time digital value.

In the count value generation circuit according to the aspect of the present disclosure, the number of times of oscillation in which the oscillator oscillates may be equal to the integer.

In the count value generation circuit according to the aspect of the present disclosure, the oscillator may stop oscillation when the oscillator oscillates by $2^n$ times, where n is a positive integer.

A physical quantity sensor module according to another aspect of the present disclosure includes the count value generation circuit according to the aspect of the present disclosure, and a physical quantity sensor that outputs the input signal.

In the physical quantity sensor module according to the aspect of the present disclosure, the physical quantity sensor may measure any one of mass, acceleration, angular velocity, angular acceleration, electrostatic capacitance, and temperature as a physical quantity.

A structure monitoring device according to another aspect of the present disclosure includes the physical quantity sensor module according to the aspect of the present disclosure, a receiver that receives a measurement signal from the physical quantity sensor module attached to a structure, and a calculator that calculates an inclination angle of the structure based on a signal output from the receiver.

DESCRIPTION OF EXEMPLARY EMBODIMENTS

Hereinafter, preferred embodiments of the present disclosure will be described in detail with reference to drawings. The embodiments described below do not unduly limit contents of the present disclosure described in the appended claims. In addition, not all of the configurations described below are necessarily essential components of the present disclosure.

As well known, there are a direct count method and a reciprocal count method as count method of frequency counters. In the direct count method, among a reference signal and a signal to be measured, the reference signal is used as an operation clock. In the reciprocal count method, contrary to the direct count method, the signal to be measured is used as the operation clock. It is considered that measurement can be performed with higher resolution by adopting the direct count method if a frequency of the reference signal is lower when comparing a frequency of the reference signal with a frequency of the signal to be measured and by adopting the reciprocal count method if frequency of the signal to be measured is lower when comparing the frequency of the reference signal with that of the signal to be measured. Accordingly, it is common to adopt a method of using the signal of the lower frequency among the signal to be measured and the reference signal as the operation clock.

In the following description, a reciprocal count value generation circuit using the reciprocal count method will be described as an example of the count value generation circuit according to the present disclosure.

1. Reciprocal Count Value Generation Circuit

The reciprocal count value generation circuit of the embodiment generates a reciprocal count value corresponding to the time when the signal X to be measured is at a high level by reciprocally counting a reference clock signal CLK with the signal X to be measured.

Figure 1:
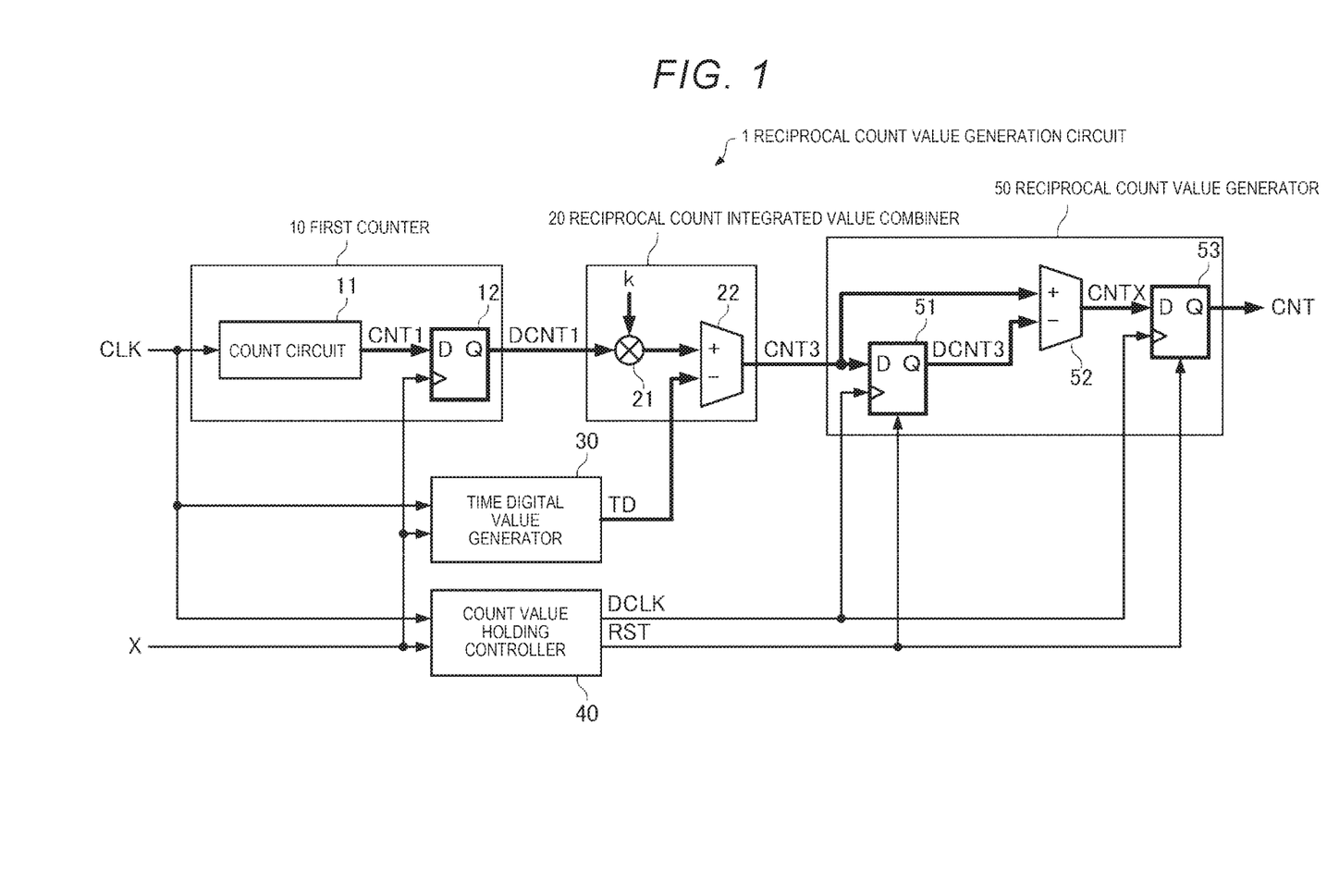
FIG. 1 is a diagram illustrating a configuration example of a reciprocal count value generation circuit of an embodiment of the present disclosure.

FIG. 1 is a diagram illustrating a configuration example of the reciprocal count value generation circuit of the embodiment. As illustrated in FIG. 1, a reciprocal count value generation circuit 1 of the embodiment includes a count circuit 11, a D flip-flop 12, a multiplier 21, a subtractor 22, a time digital value generator 30, a count value holding controller 40, a D flip-flop 51, a subtractor 52, and a D flip-flop 53. For simplicity of illustration, although only one D flip-flop 12, one D flip-flop 51, and one D flip-flop 53 are illustrated in FIG. 1, actually, L D flip-flops 12 are present, M D flip-flops 51 are present, and N D flip-flops 53 are present.

The count circuit 11 counts the number of edges of the reference clock signal CLK. In the embodiment, the count circuit 11 counts the number of rising edges of the reference clock signal CLK, and outputs a count value CNT1 of L bits.

The L D flip-flops 12 capture and hold a count value CNT1 of L bits in synchronization with the signal X to be measured. In this embodiment, the L D flip-flops 12 capture the count value CNT1 of L bits in synchronization with the rising edge and the falling edge of the signal X to be measured and holds the L-bit count value CNT1 as a count value DCNT1 of L bits. Specifically, the L D flip-flops 12 capture the count value CNT1 at the time when the rising edge of the signal X to be measured arrives and hold the count value CNT1 as the count value DCNT1 until the falling edge of the signal X to be measured arrives. The L D flip-flops 12 capture the count value CNT1 at the time when the falling edge of the signal X to be measured arrives and hold the count value CNT1 as the count value DCNT1 until the rising edge of the signal X to be measured arrives.

The count circuit 11 and the L D flip-flops 12 constitute a first counter 10 that counts the edges of the reference clock signal CLK in synchronization with the signal X to be measured and generates the count value DCNT1.

The time digital value generator 30 generates a time digital value TD corresponding to a phase difference between the reference clock signal CLK and the signal X to be measured. In the embodiment, the time digital value generator 30 generates a time digital value TD of M bits corresponding to a phase difference between the rising edge of the reference clock signal CLK and the rising edge of the signal X to be measured, and generates a time digital value TD of M bits corresponding to a phase difference between the falling edge of the reference clock signal CLK and the falling edge of the signal X to be measured. A detailed description of the time digital value generator 30 will be described later.

A count value holding controller 40 generates a clock signal DCLK and a reset signal RST based on the reference clock signal CLK and the signal X to be measured. For example, the count value holding controller 40 generates the clock signal DCLK that becomes a high pulse when the rising edge of the reference clock signal arrives a predetermined number of times (for example, eight times) after the signal X to be measured changes from a low level to a high level or from the high level to the low level. For example, the count value holding controller 40 generates a reset signal RST that becomes a high pulse when the first rising edge of the reference clock signal arrives after the signal X to be measured changes from the low level to the high level.

The multiplier 21 multiplies the count value DCNT1 of L bits by an integer k. That is, the multiplier 21 outputs a value of M bits that is k times the count value DCNT1. If the integer k is $2^n$ (that is, 2 to the power of n), the multiplier 21 can be realized as a simple circuit that shifts the count value DCNT1 by n bits.

The subtractor 22 subtracts the time digital value TD of M bits from the value of M bits output from the multiplier 21 and outputs a count value CNT3 of M bits.

The multiplier 21 and the subtractor 22 constitutes a reciprocal count integrated value combiner 20 that outputs a difference between the integer k times the count value DCNT1 generated by the first counter 10 and the time digital value TD generated by the time digital value generator 30.

The M D flip-flops 51 capture and hold the count value CNT3 of M bits in synchronization with the clock signal DCLK. In the embodiment, if the rising edge of the clock signal DCLK arrives when the reset signal RST is at the low level, the M D flip-flops 51 capture the count value CNT3 of M bits and hold the count value CNT3 as a count value DCNT3 of M bits. The M D flip-flops 51 initialize the count value DCNT3 to zero when the reset signal RST is at the high level.

The subtractor 52 subtracts the count value DCNT3 of M bits from the count value CNT3 of M bits, and outputs a count value CNTX of N bits.

The N D flip-flops 53 capture and hold a count value CNTX of N bits in synchronization with the clock signal DCLK. In the embodiment, if the rising edge of the clock signal DCLK arrives when the reset signal RST is at the low level, the N D flip-flops 53 capture the count value CNTX of N bits and hold the count value CNTX as a count value CNT of N bits. The N D flip-flops 53 initialize the reciprocal count value CNT to zero when the reset signal RST is at the high level. The reciprocal count value CNT is a value corresponding to the time when the signal X to be measured is at the high level. That is, the reciprocal count value CNT has a larger value as the time when the signal X to be measured is at the high level becomes longer, and has a smaller value as the time when the signal X to be measured is at the high level becomes shorter.

The M D flip-flops 51, the subtractor 52, and the N D flip-flops 53 constitute a reciprocal count value generator 50 that generates the reciprocal count value CNT based on the difference between the count value CNT3 output from the reciprocal count integrated value combiner 20 and the count value DCNT3. The reciprocal count value generator 50 is an example of the "count value generator" according to the present disclosure. The reciprocal count value CNT is an example of a "count value" according to the present disclosure.

The signal X to be measured is an example of the "input signal" according to the present disclosure. The reference clock signal CLK is an example of the "reference signal" according to the present disclosure. The count value DCNT1 is an example of the "first count value" according to the present disclosure. Among the two temporally consecutive count values CNT1, the preceding count value CNT1 is an example of the "first output value" according to the present disclosure and the later count value CNT1 is an example of the "second output value".

Figure 2:
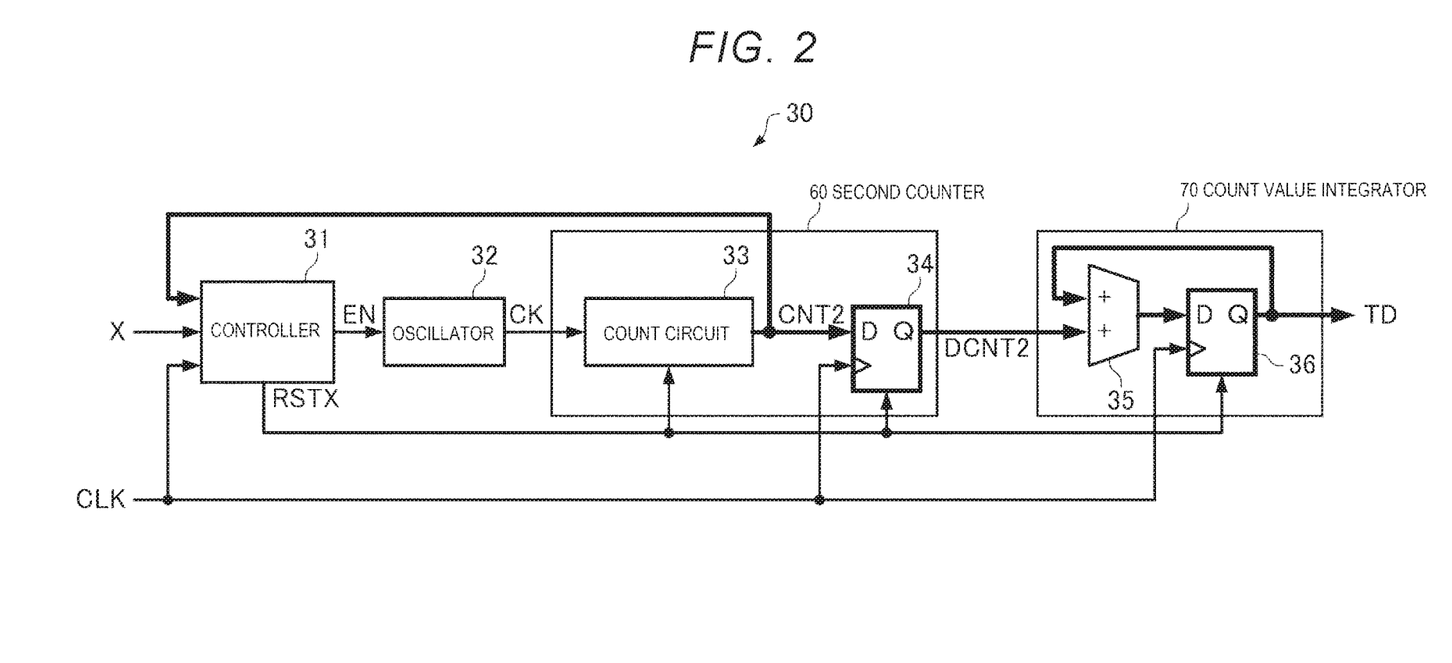
FIG. 2 is a diagram illustrating a configuration example of a time digital value generator.

FIG. 2 is a diagram illustrating a configuration example of the time digital value generator 30. As illustrated in FIG. 2, the time digital value generator 30 includes a controller 31, an oscillator 32, a count circuit 33, a D flip-flop 34, an adder 35, and a D flip-flop 36. For simplicity of illustration, although only one D flip-flop 34 and one D flip-flop 36 are illustrated in FIG. 2, actually there are K D flip-flops 34 are present and M D flip-flops 36 are present.

The controller 31 detects the rising edge and the falling edge of the signal X to be measured and sets an enable signal EN to active (for example, high level) and outputs the enable signal EN. In the embodiment, it is assumed that the enable signal EN is active when the enable signal EN is at the high level. After setting the enable signal EN to the high level, the controller 31 switches the enable signal EN from the high level to the low level when the number of rising edges of a clock signal CK output from the oscillator 32 reaches the predetermined number based on a count value CNT2 output from the count circuit 33. After switching the enable signal EN from the high level to the low level, the controller 31 makes the reset signal RSTX active and outputs the reset signal RSTX when the number of times of the rising edge of the reference clock signal CLK reaches a predetermined number of times. In the embodiment, it is assumed that the reset signal RSTX is active when the reset signal RSTX is at the high level. The controller 31 switches the reset signal RSTX from the high level to the low level at the point in time when the predetermined time has elapsed after setting the reset signal RSTX to the high level. The enable signal EN is supplied to the oscillator 32, the reset signal RSTX is supplied to the count circuit 33, the K D flip-flops 34, and the M D flip-flops 36.

Figure 3:
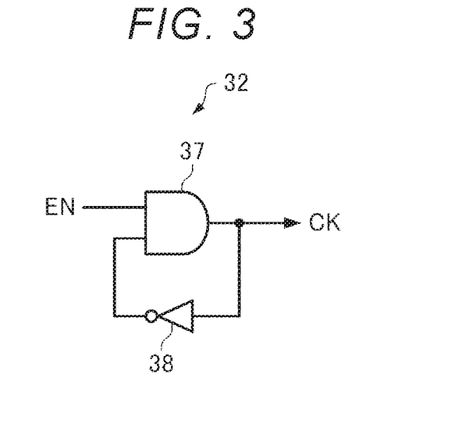
FIG. 3 is a diagram illustrating a configuration example of an oscillator.

The oscillator 32 oscillates when the enable signal EN is at the high level, and stops oscillation when the enable signal EN is at the low level. For example, as illustrated in FIG. 3, the oscillator 32 includes a two-input logical AND circuit 37 and a logic inversion circuit 38. The logical AND circuit 37 receives the enable signal EN and an output signal of the logic inversion circuit 38 and outputs a logical AND signal of the enable signal EN and the output signal of the logic inversion circuit 38. The logic inversion circuit 38 receives the output signal of the logical AND circuit 37 and outputs a logical inversion signal of the output signal of the logical AND circuit 37.

The count circuit 33 counts the number of edges of the clock signal CK. In the embodiment, the count circuit 33 counts the number of rising edges of the clock signal CK and outputs the count value CNT2 of K bits.

The K D flip-flops 34 capture and hold the count value CNT2 of K bits in synchronization with the reference clock signal CLK. In the embodiment, if the rising edge of the reference clock signal CLK arrives when the reset signal RSTX is at the low level, the K D flip-flops 34 capture the count value CNT2 of K bits and hold the count value CNT2 as the count value DCNT2 of K bits. The K D flip-flops 34 initialize the count value DCNT2 to zero when the reset signal RSTX is at the high level.

The count circuit 33 and the K D flip-flops 34 constitute a second counter 60 that counts the output signal from the oscillator 32 based on the reference clock signal CLK and generates the count value DCNT2. The count value DCNT2 is an example of the "second count value" according to the present disclosure.

The adder 35 adds the M-bit value held and output by the M D flip-flops 36 and the K-bit count value DCNT2 held by the K D flip-flops 34 to output a calculated value of M bits.

The M D flip-flops 36 capture and hold the count value CNT2 of K bits in synchronization with the reference clock signal CLK. In the embodiment, if the rising edge of the reference clock signal CLK arrives when the reset signal RSTX is at the low level, the M D flip-flops 36 capture the calculated value of M bits output from the adder 35 and holds the calculated value as the time digital value TD of M bits. The M D flip-flops 36 initialize the time digital value TD to zero when the reset signal RSTX is at the high level.

The adder 35 and the M D flip-flops 36 constitute a count value integrator 70 that integrates the count value DCNT2 to obtain an integrated value and outputs the integrated value as the time digital value.

Figure 4:
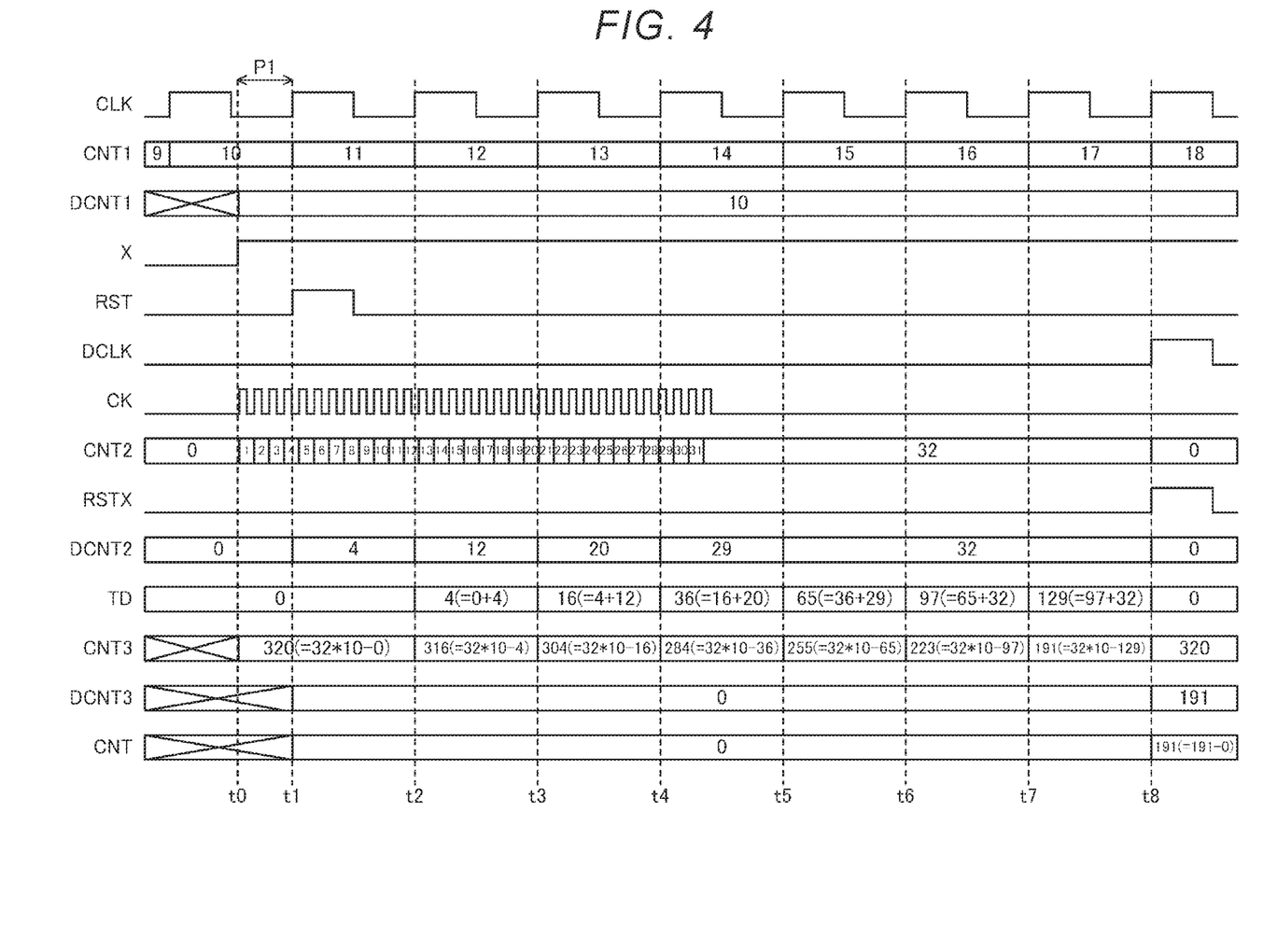
FIG. 4 illustrates an example of a timing chart in the reciprocal count value generation circuit.
Figure 5:
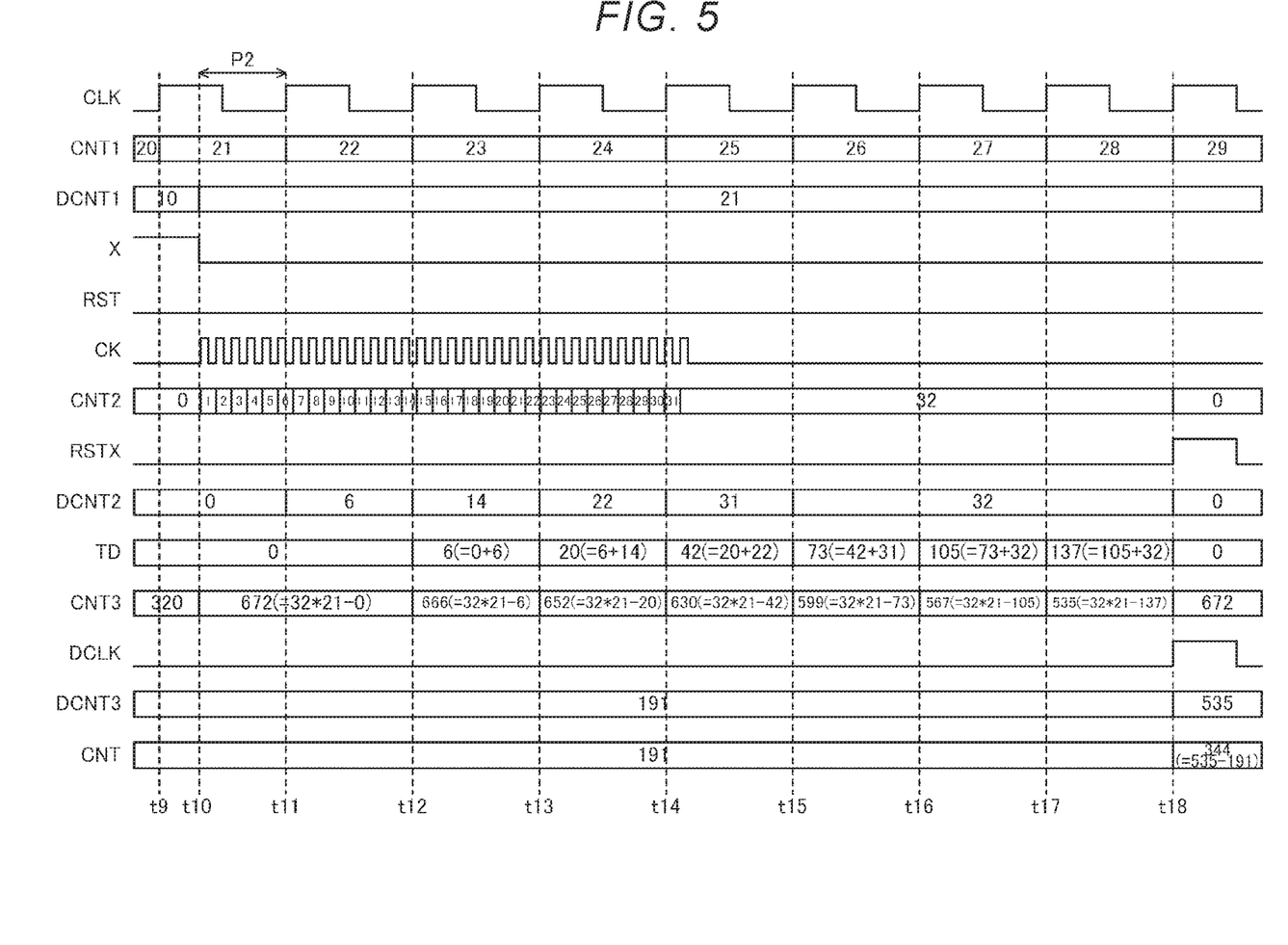
FIG. 5 illustrates another example of the timing chart in the reciprocal count value generation circuit.

Next, a detailed operation of the reciprocal count value generation circuit 1 will be described with reference to FIGS. 4 and 5. FIGS. 4 and 5 are diagrams illustrating an example of a timing chart in the reciprocal count value generation circuit 1. In the example of FIG. 4 and FIG. 5, the integer k which is input to the multiplier 21 is 32.

As illustrated in FIG. 4, the count value CNT1 increases by 1 each time the rising edge of the reference clock signal CLK arrives. When the signal X to be measured transitions from the low level to the high level at time t0, since the count value CNT1 at this time is 10, the count value DCNT1 changes to 10 and the count value CNT3 changes to 320. When the signal X to be measured transitions from the low level to the high level, oscillation of the oscillator 32 starts, and the count value CNT2 increases by 1 each time the rising edge of the clock signal CK arrives.

At time t1 when the time P1 elapses from the time t0, the first rising edge of the reference clock signal CLK after the signal X to be measured transitions to the high level arrives and the count value DCNT2 changes from 0 to 4 in synchronization with the edge. In synchronization with the edge, the reset signal RST transitions from the low level to the high level, and the count value DCNT3 and the reciprocal count value CNT are initialized to 0. Thereafter, the reset signal RST transitions from the high level to the low level, and an initialization operation for the count value DCNT3 and the reciprocal count value CNT is canceled.

At time t2, the second rising edge of the reference clock signal CLK arrives, the count value DCNT2 changes from 4 to 12 and the time digital value TD changes from 0 to 4 in synchronization with the edge. The count value CNT3 changes from 320 to 316 in synchronization with the edge.

At time t3, the third rising edge of the reference clock signal CLK arrives, the count value DCNT2 changes from 12 to 20 and the time digital value TD changes from 4 to 16 in synchronization with the edge. The count value CNT3 changes from 316 to 304 in synchronization with the edge.

At time t4, the fourth rising edge of the reference clock signal CLK arrives, the count value DCNT2 changes from 20 to 29 and the time digital value TD changes from 16 to 36 in synchronization with the edge. The count value CNT3 changes from 304 to 284 in synchronization with the edge. Thereafter, when the count value CNT2 reaches 32, oscillation of the oscillator 32 stops, and the count value CNT2 is held at 32.

At time t5, the fifth rising edge of the reference clock signal CLK arrives, the count value DCNT2 changes from 29 to 32 and the time digital value TD changes from 36 to 65 in synchronization with the edge. The count value CNT3 changes from 284 to 255 in synchronization with the edge.

At time t6, the sixth rising edge of the reference clock signal CLK arrives, the time digital value TD changes from 65 to 97 and the count value CNT3 changes from 255 to 223 in synchronization with the edge. The count value DCNT2 remains unchanged at 32.

At time t7, the seventh rising edge of the reference clock signal CLK arrives, the time digital value TD changes from 97 to 129 and the count value CNT3 changes from 223 to 191 in synchronization with the edge. The count value DCNT2 remains unchanged at 32.

At time t8, the eighth rising edge of the reference clock signal CLK arrives, the clock signal DCLK transitions from the low level to the high level and the count value DCNT3 and the reciprocal count value CNT change from 0 to 191, in synchronization with the edge. In synchronization with the edge, the reset signal RSTX transitions from the low level to the high level and the count value CNT2, the count value DCNT2, and the time digital value TD are initialized to zero. Since the time digital value TD has changed to 0, the count value CNT3 changes from 191 to 320. Thereafter, the reset signal RSTX transitions from the high level to the low level, and initialization of the count value CNT2, the count value DCNT2, and the time digital value TD is canceled.

Thereafter, as the time elapses, as illustrated in FIG. 5, at time t9, the eleventh rising edge of the reference clock signal CLK arrives and the count value CNT1 changes from 20 to 21. At time t10, when the measured signal X transitions from the high level to the low level, since the count value CNT1 at this time is 21, the count value DCNT1 changes from 10 to 21, and the count value CNT3 changes from 320 to 672. When the signal X to be measured transitions from the high level to the low level, the oscillation of the oscillator 32 starts, and the count value CNT2 increases by 1 each time the rising edge of the clock signal CK arrives.

At time t11 when the time P2 elapses from the time t10, the twelfth rising edge of the reference clock signal CLK arrives and the count value DCNT2 changes from 0 to 6 in synchronization with the edge.

At time t12, the thirteenth rising edge of the reference clock signal CLK arrives, the count value DCNT2 changes from 6 to 14 and the time digital value TD changes from 0 to 6 in synchronization with the edge. The count value CNT3 changes from 672 to 666 in synchronization with the edge.

At time t13, the fourteenth rising edge of the reference clock signal CLK arrives, the count value DCNT2 changes from 14 to 22 and the time digital value TD changes from 6 to 20 in synchronization with the edge. The count value CNT3 changes from 666 to 652 in synchronization with the edge.

At time t14, the fifteenth rising edge of the reference clock signal CLK arrives, the count value DCNT2 changes from 22 to 31 and the time digital value TD changes from 20 to 42 in synchronization with the edge. The count value CNT3 changes from 652 to 630 in synchronization with the edge. Thereafter, when the count value CNT2 reaches 32, oscillation of the oscillator 32 stops, and the count value CNT2 is held at 32.

At time t15, the sixteenth rising edge of the reference clock signal CLK arrives, the count value DCNT2 changes from 31 to 32 and the time digital value TD changes from 42 to 73 in synchronization with the edge. The count value CNT3 changes from 630 to 599 in synchronization with the edge.

At time t16, the seventeenth rising edge of the reference clock signal CLK arrives, the time digital value TD changes from 73 to 105 and the count value CNT3 changes from 599 to 567 in synchronization with the edge. The count value DCNT2 remains unchanged at 32.

At time t17, the eighteenth rising edge of the reference clock signal CLK arrives, the time digital value TD changes from 105 to 137 and the count value CNT3 changes from 567 to 535 in synchronization with the edge. The count value DCNT2 remains unchanged at 32.

At time t18, the nineteenth rising edge of the reference clock signal CLK arrives, the clock signal DCLK transitions from the low level to the high level, the count value DCNT3 change from 191 to 535 and the reciprocal count value CNT change from 191 to 344, in synchronization with the edge. In synchronization with the edge, the reset signal RSTX transitions from the low level to the high level and the count value CNT2, the count value DCNT2, and the time digital value TD are initialized to zero. Since the time digital value TD has changed to 0, the count value CNT3 changes from 535 to 672. Thereafter, the reset signal RSTX transitions from the high level to the low level, and initialization of the count value CNT2, the count value DCNT2, and the time digital value TD is canceled.

Here, the time P2 from the time t10 to the time t11 illustrated in FIG. 5 is longer than the time P1 from the time t0 to the time t1 illustrated in FIG. 4. The time digital value TD at each time from the time t12 to the time t18 transitions so as to be larger than the time digital value TD at each time from the time t2 to the time t8. Therefore, as the time interval between the edge of the signal X to be measured and the rising edge of the reference clock signal CLK is longer, the time digital value TD becomes larger. Then, the time digital value TD after the change at the time t7, that is, 129 corresponds to the time P1, and the time digital value TD after the change at the time t17, that is, 137 corresponds to the time P2.

In the examples of FIGS. 4 and 5, if the time of one cycle of the reference clock signal CLK is set as T, the time during which the signal to be measured is at the high level is $T \times (21-10) + P1 - P2 = (T \times 21 - P2) - (T \times 10 - P1)$. Here, the count value CNT3 after the change at time t7, that is, 191 $(=32 \times 10 - 129)$ corresponds to $(T \times 10 - P1)$, and the count value CNT3 after the change at the time t17, that is, 535 $(=32 \times 21 - 137)$ corresponds to $(T \times 21 - P2)$. Accordingly, the reciprocal count value CNT after the change at time t18, that is, 344 $(=535-191)$ corresponds to the time during which the signal to be measured is at the high level.

As such, according to the reciprocal count value generation circuit 1 of the embodiment, since the reciprocal count value CNT corresponding to the time during which the signal to be measured is at the high level is obtained without using a plurality of signals to be measured having different phases, accuracy of the reciprocal count value CNT can be improved.

According to the reciprocal count value generation circuit 1 of the embodiment, since a simple configuration using the first counter 10, the reciprocal count integrated value combiner 20, the time digital value generator 30, and the reciprocal count value generator 50 can be realized and the time digital value generator 30 can also be realized with a simple configuration using the oscillator 32 and the second counter 60, a circuit area can be reduced.

In the examples of FIGS. 4 and 5, since the oscillator 32 stops when it oscillates 32 times and the count value DCNT2 is held at 32, the time digital value TD increases by 32 every time the rising edge of the reference clock signal CLK arrives after the oscillator 32 stops. On the other hand, since the integer k is 32, which is the same as the number of times of oscillations, consistency can be obtained between k times the count value DCNT1 of the first counter 10 and the time digital value TD, so that accuracy of the reciprocal count value CNT is increased. As such, it is preferable that the number of times of oscillations of the oscillator 32 is equal to the integer k. Furthermore, at this time, it is preferable that the number of times of oscillations of the oscillator 32, that is, the integer k is $2^n$ (that is 2 to the power of n). By doing as described above, the multiplier 21 can be realized as a simple circuit that shifts the count value DCNT1 by n bits.

The reciprocal count value generation circuit 1 of the embodiment generates the reciprocal count value corresponding to the time during which the signal X to be measured is at the high level, but may generate a reciprocal count value corresponding to the time during which the signal X to be measured is at the low level, or a reciprocal count value corresponding to the time interval between two rising edges or two falling edges of the signal X to be measured.

In the embodiment described above, the reciprocal counting method is adopted because the frequency of the signal X to be measured is lower than the frequency of the reference signal CLK. However, the present disclosure is not limited to the reciprocal count method, and the same effect can be obtained by allowing the reciprocal count value generation circuit 1 to operate by inputting the signal X to be measured as the CLK input of FIG. 1 and inputting the reference signal as the input of the signal X to be measured. Therefore, in the present disclosure, the "direct count method" may be adopted instead of the "reciprocal count method" irrespective of magnitude of a frequency.

2. Physical Quantity Sensor Module

The physical quantity sensor module of the embodiment includes the reciprocal count value generation circuit 1 of the embodiment described above and a physical quantity sensor outputting the signal X to be measured which is an input signal of the reciprocal count value generation circuit 1, and outputs packet data incorporating measurement data of the physical quantity. Hereinafter, a physical quantity sensor module 100, which is an acceleration sensor for measuring acceleration as a physical quantity, will be described as an example.

Figure 6:
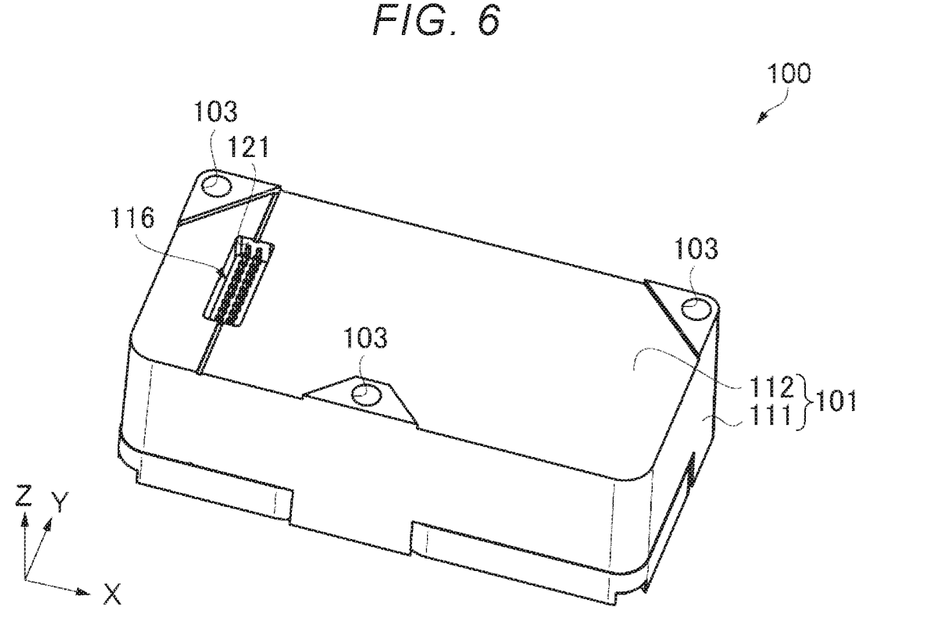
FIG. 6 is a perspective view illustrating a configuration of an appearance of a physical quantity sensor module.

FIG. 6 is a perspective view illustrating a configuration of the physical quantity sensor module 100 when viewed from a side of a mounted surface to which the physical quantity sensor module 100 is fixed. In the following description, description will be made by setting a direction along the long side of the physical quantity sensor module 100 having a rectangular shape in a plan view as an X-axis direction, setting a direction orthogonal to the X-axis direction in a plan view as a Y-axis direction, and setting a thickness direction of the physical quantity sensor module 100 as a Z-axis direction.

The physical quantity sensor module 100 is a rectangular parallelepiped having a rectangular planar shape. For example, the length of the long side along the X-axis direction is approximately 50 mm and the length of the short side along the Y-axis direction orthogonal to the X-axis direction is approximately 24 mm, and the thickness is about 16 mm. Screw holes 103 are formed at two places near both end portions of one long side and at one place in the central portion of the other long side. The physical quantity sensor module 100 is used in a fixed state to each of the three screw holes 103 through fixing screws, for example, on a mounted surface of a mounted object (device) of a structure such as a bridge or a bulletin board.

As illustrated in FIG. 6, an opening 121 is provided on the front surface of the physical quantity sensor module 100 when viewed from the mounted surface side. Inside the opening 121, a plug type connector 116 is disposed. The connector 116 has a plurality of pins disposed in two rows, and in each row, a plurality of pins are arranged in the Y-axis direction. A socket type connector (not illustrated) is coupled to the connector 116 from the mounted object, and a drive voltage of the physical quantity sensor module 100 and electric signals such as detection data are transmitted and received through the connector.

Figure 7:
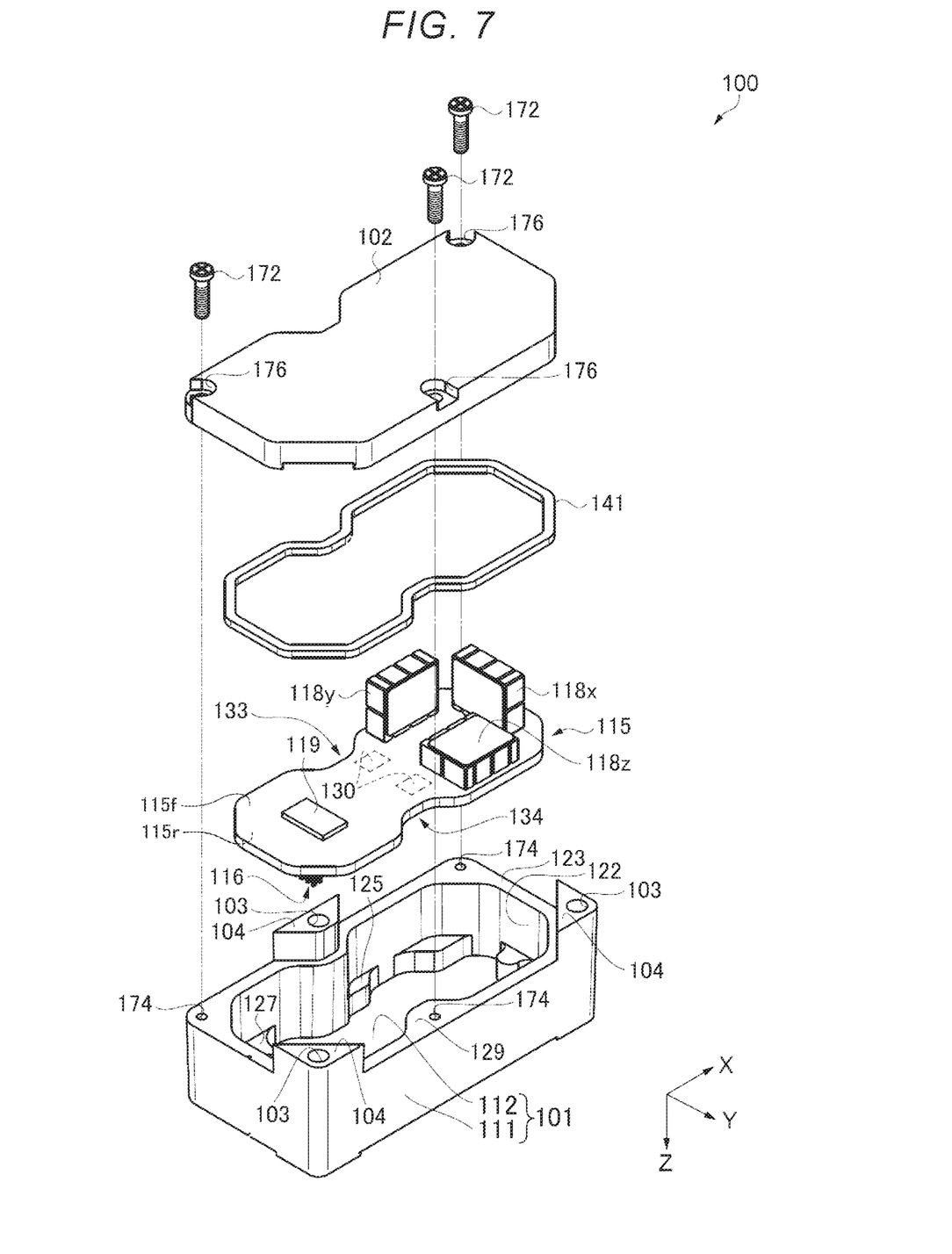
FIG. 7 is an exploded perspective view illustrating a configuration of a physical quantity sensor module.

FIG. 7 is an exploded perspective view of the physical quantity sensor module 100. As illustrated in FIG. 7, the physical quantity sensor module 100 is configured to include a container 101, a lid portion 102, a seal member 141, a circuit board 115, and the like. More specifically, the physical quantity sensor module 100 is configured such that the circuit board 115 is attached to the interior of the container 101 with a fixing member 130 interposed therebetween, and the opening of the container 101 is covered with a lid portion 102 via a seal member 141 having cushioning property.

The container 101 is made of, for example, aluminum, and is an accommodation container of the circuit board 115 formed into a box shape having an internal space. The container 101 can be formed by scraping out aluminum, or by using a die casting method (mold casting method). The material of the container 101 is not limited to aluminum, but other metal such as zinc or stainless steel, a resin, a composite material of metal and resin, or the like may be used. The outer shape of the container 101 is a rectangular parallelepiped having a substantially rectangular planar shape similarly to the whole shape of the physical quantity sensor module 100 described above, and fixing projections 104 are provided at two places near both end portions of one long side and one place in the central portion of the other long side. The screw hole 103 is formed in each of the fixing projections 104. Here, the fixing projections 104 provided at two places near both end portions of one long side include the intersection of the short side and the long side, and are substantially triangular in a plan view. Further, the fixing projection 104 provided at one place in the central portion of the other long side has a substantially trapezoidal shape facing the inner space side of the container 101 in a plan view.

The container 101 has a box-like shape whose outer shape is rectangular parallelepiped and opened to one side. The interior of the container 101 is an internal space (accommodating space) surrounded by a bottom wall 112 and side walls 111. In other words, the container 101 has a box shape having one surface facing the bottom wall 112 as an opening surface 123, the outer edge of the circuit board 115 is disposed (accommodated) along an inner surface 122 of the side wall 111, and the lid portion 102 is fixed so as to cover the opening. Here, an opening surface 123 facing the bottom wall 112 is a surface on which the lid portion 102 is placed. On the opening surface 123, the fixing projections 104 are erected at two places near both end portions of one long side and one place in the central portion of the other long side of the container 101. The upper surface (surface exposed in the −Z-direction) of the fixing projections 104 is flush with the upper surface of the container 101.

A projection 129, which is the center portion of one long side opposed to the fixing projection 104 provided at the central portion of the other long side and protrudes from the side wall 111 toward the internal space from the bottom wall 112 to the opening surface 123, is provided in the internal space of the container 101. A female screw 174 is provided on the upper surface (the same surface as the opening surface 123) of the projection 129. The lid portion 102 is fixed to the container 101 through the seal member 141 by screws 172 and the female screws 174 inserted through the through-holes 176. Here, similar to the projection 129, the fixing projection 104 provided at the central portion of the other long side may be configured to be protruded from the side wall 111 toward the internal space from the bottom wall 112 to the opening surface 123. The projection 129 and the fixing projection 104 are provided at positions facing constricted portions 133 and 134 of the circuit board 115 described later.

In the inner space of the container 101, a first pedestal 127 and a second pedestal 125 which project in a stepwise manner from the bottom wall 112 toward the opening surface 123 side by one step are provided. The first pedestal 127 is provided at a position opposed to a disposition area of the plug type (male) connector 116 attached to the circuit board 115, and an opening 121 (see FIG. 6) into which the plug type (male) connector 116 is inserted is provided. The first pedestal 127 functions as a pedestal for fixing the circuit board 115 to the container 101. The opening 121 penetrates the inside (inner side) and the outside of the container 101.

The second pedestal 125 is positioned on the side opposite to the first pedestal 127 with respect to the fixing projection 104 and the projection 129 respectively positioned at the central portions of the long sides and is provided in the vicinity of the fixing projection 104 and the projection 129. The second pedestal 125 may be coupled to either the fixing projection 104 or the projection 129. The second pedestal 125 functions as a pedestal for fixing the circuit board 115 to the container 101 on the side opposite to the first pedestal 127 with respect to the fixing projection 104 and the projection 129.

Although the outer shape of the container 101 has been described as being a rectangular parallelepiped having a substantially rectangular planar shape and a box-like shape without a lid, but is not limited thereto, and the planar shape of the outer shape of the container 101 may be a square shape, a hexagonal shape, an octagonal shape, or the like. In the planar shape of the outer shape of the container 101, corners of apex portions of a polygon may be chamfered, and furthermore, any of sides may be a planar shape formed by a curve. The planar shape of the interior of the container 101 is also not limited to the shape described above, and other shapes may be adopted. Furthermore, the outer shape of the container 101 and the planar shape of the inside thereof may be similar or not similar.

The circuit board 115 is a multilayer board having a plurality of through-holes and the like formed therein, and a glass epoxy board is used as the circuit board 115. The circuit board 115 is not limited to a glass epoxy board, but may be a rigid board capable of mounting a plurality of physical quantity sensors, electronic components, connectors, and the like. For example, a composite substrate or ceramic substrate may also be used.

The circuit board 115 has a second surface 115r on the bottom wall 112 side and a first surface 115f which is in a front and back relationship with the second surface 115r. On the first surface 115f of the circuit board 115, a control IC 119 as a processor and acceleration sensors 118x, 118y, and 118z as physical quantity sensors are mounted. The connector 116 is mounted on the second surface 115r of the circuit board 115. Although illustration and explanation thereof are omitted, other wiring, terminal electrodes, and the like may be provided on the circuit board 115.

The circuit board 115 includes the constricted portions 133 and 134 whose outer edges of the circuit board 115 are constricted at the central portion in the X-axis direction along the long side of the container 101 in a plan view. The constricted portions 133, 134 are provided on both sides of the circuit board 115 in the Y-axis direction in a plan view and constricted from the outer edge of the circuit board 115 toward the center. The constricted portions 133 and 134 are provided to face the projection 129 and the fixing projection 104 of the container 101.

The circuit board 115 is inserted into the internal space of the container 101 with the second surface 115r facing the first pedestal 127 and the second pedestal 125. The circuit board 115 is supported by the container 101 by the first pedestal 127 and the second pedestal 125.

Acceleration sensors 118x, 118y, and 118z for measuring acceleration as a physical quantity respectively measure accelerations in one axial direction. Specifically, the acceleration sensor 118x is erected so that the front and back surfaces of a package are oriented in the X-axis direction and also the side surfaces face the first surface 115f of the circuit board 115. Then, the acceleration sensor 118x measures acceleration applied in the X-axis direction. The acceleration sensor 118y is erected such that the front and back surfaces of the package are oriented in the Y-axis direction and also the side surfaces face the first surface 115f of the circuit board 115. Then, the acceleration sensor 118y measures acceleration applied in the Y-axis direction. The acceleration sensor 118z is provided so that the front and back surfaces of the package are oriented in the Z-axis direction, that is, the front and back surfaces of the package are directly facing the first surface 115f of the circuit board 115. Then, the acceleration sensor 118z measures acceleration applied in the Z-axis direction.

The control IC 119 as a processor is electrically coupled to the acceleration sensors 118x, 118y, and 118z through wirings (not illustrated). The control IC 119 is a micro controller unit (MCU), which incorporates the reciprocal count value generation circuit 1 of the embodiments described above, a storing unit including a nonvolatile memory, and the like, controls each component of the physical quantity sensor module 100, generates detection data based on the output signals of the acceleration sensors 118x, 118y, and 118z, and generates packet data incorporating the detection data. The storing unit stores a program that defines the sequence and contents for measuring acceleration, a program that incorporates detection data into packet data, accompanying data, and the like. Although not illustrated, a plurality of other electronic components and the like may be mounted on the circuit board 115.

Here, the configurations of the acceleration sensors 118x, 118y, and 118z will be described with reference to FIGS. 8 and 9.

Figure 8:
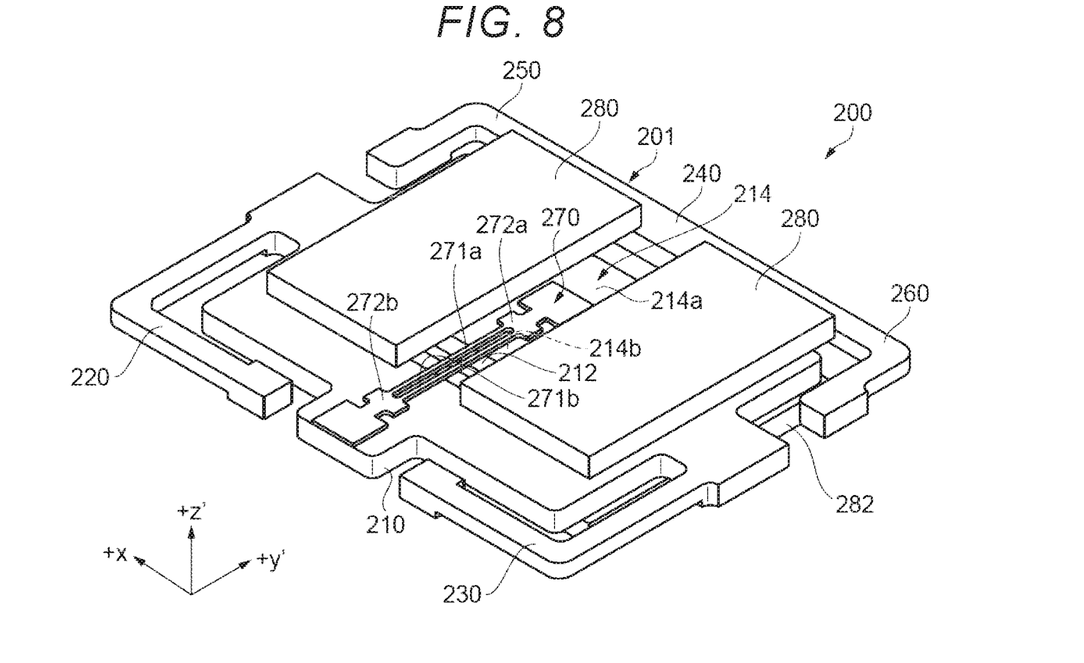
FIG. 8 is a perspective view illustrating a configuration of an acceleration sensor element.

FIG. 8 is a perspective view for explaining a schematic configuration of a sensor element for measuring acceleration. FIG. 9 is a cross-sectional view illustrating a schematic configuration of an acceleration detector using the sensor element for measuring acceleration.

In FIG. 8, an x-axis, a y'-axis, and a z'-axis are illustrated as three axes orthogonal to each other. An example in which, in (for) each of the axes, in an orthogonal coordinate system consisting of the x-axis as an electric axis of quartz crystal which is a piezoelectric material used as a base material of an acceleration sensor, a y-axis as a mechanical axis, and a z-axis as an optical axis, when the axis obtained by inclining the z-axis by a rotation angle φ (preferably $-5° \leq \varphi \leq 15°$) with the x-axis as the rotation axis so that the +z side rotates in the −y direction of the y-axis is set as the z'-axis and the axis obtained by inclining the y-axis by the rotation angle φ with the x-axis as the rotation axis so that the +y side rotates in the +z direction of the z-axis is set as the y'-axis, a so-called quartz crystal z-plate (z'-plate) which is cut along a plane defined by the x-axis and the y'-axis and processed into a flat plate shape and has a predetermined thickness t in the z'-axis direction orthogonal to the plane is used as a base material will be described. The z'-axis is an axis along the direction in which gravity acts in the acceleration sensors 118x, 118y, and 118z.

First, a configuration of a sensor element 200 for measuring acceleration will be described with reference to FIG. 8. The sensor element 200 includes a substrate structure 201 including a base portion 210 and the like, an acceleration measurement element 270 coupled to the substrate structure 201 and measuring the physical quantity, and mass portions 280 and 282.

The substrate structure 201 of the sensor element 200 includes the base portion 210, a movable portion 214 coupled to the base portion 210 through a joint portion 212, and a connection portion 240, and a first support portion 220, a second support portion 230, a third support portion 250, and a fourth support portion 260 that are provided to be coupled to the base portion 210. Here, the third support portion 250 and the fourth support portion 260 are coupled at the side where the connection portion 240 is disposed.

As the substrate structure 201, a quartz crystal substrate of the quartz crystal z-plate (z'-plate) cut out at a predetermined angle from a quartz crystal rough stone or the like which is a piezoelectric material is used. By patterning the quartz crystal substrate, the support portions are integrally formed as a substrate structure 201. For patterning, for example, a photolithography technique and a wet etching technique can be used.

The base portion 210 is coupled to the movable portion 214 through the joint portion 212, and supports the movable portion 214. The base portion 210 is coupled to the movable portion 214 through the joint portion 212, the connection portion 240 positioned on a side opposite to the side, where the joint portion 212 is positioned, of the movable portion, the first support portion 220 and the second support portion 230, and the third support portion 250 and the fourth support portion 260 coupled to each other at the connection portion 240 side.

The joint portion 212 is provided between the base portion 210 and the movable portion 214, and is coupled to the base portion 210 and the movable portion 214. The thickness (length in the z'-axis direction) of the joint portion 212 is thin (short) as compared with the thickness of the base portion 210 and the thickness of the movable portion 214, and the joint portion 212 is formed in a constricted shape in a cross-sectional view from the x-axis direction. The joint portion 212 is formed, for example, as a thin-walled portion having a small thickness by performing so-called half etching on the substrate structure 201 including the joint portion 212. The joint portion 212 has a function as a rotation axis along the x-axis direction as a fulcrum (intermediate hinge) when the movable portion 214 is displaced (pivots) with respect to the base portion 210.

The movable portion 214 is coupled to the base portion 210 through the joint portion 212. The movable portion 214 has a plate shape, and has principal surfaces 214a and 214b facing each other along the z'-axis direction and having the front and back relationship. The movable portion 214 is displaced in a direction (z'-axis direction) intersecting the principal surfaces 214a and 214b with the joint portion 212 as a fulcrum (rotation axis), according to acceleration which is a physical quantity applied in the direction (z'-axis direction) intersecting the principal surfaces 214a and 214b.

The connection portion 240 extends from the base portion 210 on the +x direction side provided with the third support portion 250 described later along the x-axis direction so as to surround the movable portion 214, and is provided to be coupled to the base portion 210 on the −x direction side where the fourth support portion 260 described later is provided.

The first support portion 220 and the second support portion 230 are provided symmetrically with respect to the acceleration measurement element 270. The third support portion 250 and the fourth support portion 260 are provided symmetrically with respect to the acceleration measurement element 270. In the first support portion 220, the second support portion 230, the third support portion 250 and the fourth support portion 260, the substrate structure 201 is supported by a fixed portion.

The acceleration measurement element 270 is coupled to the base portion 210 and the movable portion 214. In other words, the acceleration measurement element 270 is provided so as to straddle the base portion 210 and the movable portion 214. The acceleration measurement element 270 includes vibrating beam portions 271a and 271b as a vibrating portion, a first base portion 272a, and a second base portion 272b. In the acceleration measurement element 270 in which the first base portion 272a and the second base portion 272b are coupled to the base portion 210, for example, the movable portion 214 is displaced according to the physical quantity so that stress is generated in the vibrating beam portions 271a and 271b and physical quantity detection information generated in the vibrating beam portions 271a and 271b changes. In other words, the vibration frequency (resonance frequency) of the vibrating beam portions 271a and 271b changes. The acceleration measurement element 270 in this embodiment is a double-ended tuning fork element (double-ended tuning fork type vibration element) having two vibrating beam portions 271a and 271b, the first base portion 272a, and the second base portion 272b. Here, the vibrating beam portions 271a and 271b as the vibrating portion may be referred to as a vibrating arm, a vibrating beam, a columnar beam, or the like in some cases.

As the acceleration measurement element 270, a quartz crystal substrate of a quartz crystal z-plate (z'-plate) cut out at a predetermined angle described above, similarly to the substrate structure 201, from a quartz crystal rough stone or the like which is a piezoelectric material is used. The acceleration measurement element 270 is formed by patterning the quartz crystal substrate by a photolithography technique and an etching technique. With this configuration, the vibrating beam portions 271a and 271b, the first base portion 272a, and the second base portion 272b can be integrally formed.

The material of the acceleration measurement element 270 is not limited to the quartz crystal substrate described above. As the material of the acceleration measurement element 270, for example, a semiconductor material such as, a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN), or silicon having a piezoelectric material (piezoelectric material) film such as zinc oxide (ZnO) or aluminum nitride (AlN) can be used. In this case, it is preferable that similar materials are used for the substrate structure 201 and the acceleration measurement element 270.

Although illustration and explanation are omitted, an extraction electrode and an excitation electrode may be provided in the acceleration measurement element 270.

The mass portions 280 and 282 are provided on the principal surface 214a of the movable portion 214 and the principal surface 214b serving as the back surface in a front and back relationship between the principal surfaces 214a and 214b. Specifically, the mass portions 280 and 282 are provided on the principal surface 214a and the principal surface 214b through a mass bonding material (not illustrated). Examples of the material of the mass portions 280 and 282 include metals such as copper (Cu) and gold (Au).

In this embodiment, the acceleration measurement element 270 is configured by a double-ended tuning fork oscillator (double-ended tuning fork type vibrating element) in which the vibrating portion is configured by two columnar beams of the vibrating beam portions 271a and 271b, but this acceleration measurement element 270 can also be configured by one columnar beam (single beam).

Next, a configuration of an acceleration detector 300 using the sensor element 200 for measuring acceleration will be described with reference to FIG. 9.

Figure 9:
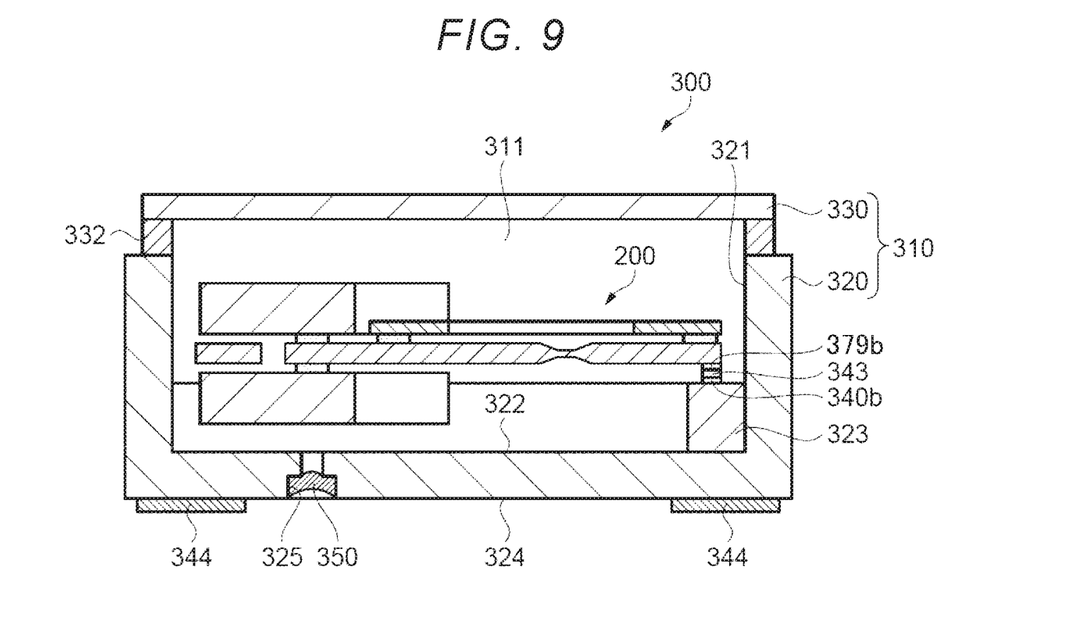
FIG. 9 is a cross-sectional view illustrating a configuration of an acceleration detector.

As illustrated in FIG. 9, the sensor element 200 described above is mounted on the acceleration detector 300. The acceleration detector 300 includes the sensor element 200 and a package 310. The package 310 includes a package base 320 and a lid 330. Then, the sensor element 200 is accommodated in the package 310 of the acceleration detector 300. Specifically, the sensor element 200 is accommodated in a space 311 provided by coupling the package base 320 and the lid 330.

The package base 320 has a recess 321, and the sensor element 200 is provided in the recess 321. The shape of the package base 320 is not particularly limited as long as it can accommodate the sensor element 200 in the recess 321. As the package base 320 in this embodiment, for example, a material such as ceramics, quartz crystal, glass or silicon can be used.

The package base 320 has a step portion 323 protruding toward the lid 330 from an inner bottom surface 322 which is the bottom surface inside the recess of the package base 320. The step portion 323 is provided along the inner wall of the recess 321, for example. The step portion 323 is provided with a plurality of internal terminals 340b.

Each of the internal terminal 340b is provided so as to face a position overlapping with a fixing-portion connection terminal 379b, which is provided on each of the fixing portions of the first support portion 220, the second support portion 230, the third support portion 250, and the fourth support portion 260 of the sensor element 200, in a plan view. Each of the internal terminal 340b is electrically coupled to the fixing-portion connection terminal 379b using a silicone resin-based conductive adhesive 343 containing a conductive material such as a metal filler, for example. As such, the sensor element 200 is mounted on the package base 320 and accommodated in the package 310.

In the package base 320, on an outer bottom surface 324 which is an opposite surface to the inner bottom surface 322, external terminals 344 used when being mounted on an external member are provided. Each of the external terminals 344 is electrically coupled to each of the internal terminal 340b through an internal wiring (not illustrated).

The internal terminal 340b and the external terminal 344 are formed of a metal film obtained by laminating a film of nickel (Ni), gold (Au), or the like is laminated on a metalized layer of tungsten (W) or the like by plating or the like.

The package base 320 is provided with a sealing portion 350 for sealing the inside of the package 310 at the bottom portion of the recess 321. The sealing portion 350 is provided in a through-hole 325 formed in the package base 320. The through-hole 325 penetrates from the outer bottom surface 324 to the inner bottom surface 322. In the example illustrated in FIG. 9, the through-hole 325 has a stepped shape in which a hole diameter on the outer bottom surface 324 side is larger than the hole diameter on the inner bottom surface 322 side. The sealing portion 350 is formed by disposing a sealing material made of, for example, gold (Au) and germanium (Ge) alloy, solder, and the like in the through-hole 325, heating and melting the sealing material, and solidifying the sealing material. The sealing portion 350 is provided to hermetically seal the inside of the package 310.

The lid 330 is provided so as to cover the recess 321 of the package base 320. The shape of the lid 330 is, for example, a plate shape. As the lid 330, for example, the same material as the package base 320, an alloy of iron (Fe) and nickel (Ni), a metal such as stainless steel or the like can be used. The lid 330 is joined to the package base 320 through a lid joining member 332. As the lid joining member 332, for example, a seam ring, a low melting point glass, an inorganic adhesive or the like can be used.

The inside of the package 310 can be hermetically sealed by providing the sealing portion 350 by the disposing the sealing material in the through-hole 325, heating and melting the sealing material, and solidifying the sealing material in a state where the inside of the package 310 is depressurized (in a state of high degree of vacuum) after the lid 330 is joined to the package base 320. The inside of the package 310 may be filled with an inert gas such as nitrogen, helium or argon.

In the acceleration detector 300, when a drive signal is given to the excitation electrode of the sensor element 200 through the external terminal 344, the internal terminal 340b, the fixing-portion connection terminal 379b, and the like, the vibrating beam portions 271a and 271b of the sensor element 200 vibrate at a predetermined frequency. Then, the acceleration detector 300 outputs the resonance frequency of the sensor element 200, which changes according to the applied acceleration, as an output signal. The acceleration detector 300 can be used as the acceleration sensors 118x, 118y, and 118z of the physical quantity sensor module 100 described above, and each of the acceleration sensors 118x, 118y, and 118z outputs a measured signal X having a frequency corresponding to applied acceleration.

According to the physical quantity sensor module 100 of the embodiment described as above, since the physical quantity sensor module 100 includes the reciprocal count value generation circuit 1 capable of generating a highly accurate reciprocal count value, it is possible to measure the physical quantity with high accuracy.

In the description as above, the physical quantity sensor module 100 including the acceleration sensors 118x, 118y, and 118z is described as an example of the physical quantity sensor. However, a physical quantity sensor module including a physical quantity sensor for measuring at least one of mass, angular velocity, angular acceleration, electrostatic capacitance and temperature as the physical quantity may be adopted.

A quartz crystal microbalance (QCM) is known as a method of measuring a minute mass change in a mass sensor that measures mass as a physical quantity. In such a mass sensor, the matters that the oscillation frequency of the crystal oscillator decreases as an amount of substances attached to the quartz crystal oscillator electrode surface increases, and the oscillation frequency increases as the attached substance amount decreases are utilized. Measurement sensitivity of the mass sensor as described above can be calculated by Sauerbrey's equation. For example, in the case of an AT-cut quartz crystal resonator having a fundamental frequency of 27 MHz, a decrease in the frequency of 1 Hz corresponds to a mass increase of 0.62 ng/cm$^2$ on the electrode surface.

In a case where an object spinning at angular velocity ω is observed from an observation point spinning at angular velocity Ω, an angular velocity sensor measuring the angular velocity or angular acceleration as a physical quantity measures the angular velocity using the matters that the angular velocity of the object appears as "ω-Ω". In such an angular velocity sensor, matters that an appearing resonance frequency observed from the electrode changes when a sensor element receives angular acceleration in a state where a wave having a natural frequency is circulated by electrostatically driving disc-shaped mass using an electrode are utilized. In the angular velocity sensor as described above, there is no limitation on a bandwidth in principle, and for example, accuracy improvement of technology related to frequency measurement and nonlinearity correction directly leads to higher sensitivity of the measurement sensitivity.

In an electrostatic capacitance sensor that measures electrostatic capacitance as the physical quantity, it is possible to measure electrostatic capacitance to be measured by causing RC oscillation to occur using a reference resistance and electrostatic capacitance to be measured and measuring an oscillation frequency. Then, the matters that the time constant given by the RC changes and the oscillation frequency shifts when the electrostatic capacitance to be measured changes are utilized. In the electrostatic capacitance sensor, various error factors can be eliminated in such a way that reference electrostatic capacitance is prepared separately from the capacitance to be measured, the RC oscillation is caused by using the reference resistance and the reference electrostatic capacitance, and this RC oscillation is set as a reference oscillation frequency to thereby set a mechanism for detecting the difference between the reference oscillation frequency and the previous oscillation frequency.

In a temperature sensor that measures temperature as a physical quantity, temperature measurement can be performed by causing RC oscillation to occur using a thermistor and a reference electrostatic capacitance and measuring the oscillation frequency. Then, the matters that the time constant given by the RC changes and the oscillation frequency shifts when a resistance value of a thermistor varies with temperature are utilized. In the temperature sensor, various error factors can be eliminated in such a way that a reference resistance is prepared separately from the thermistor, the RC oscillation is caused by using the reference resistance and the reference electrostatic capacitance, and this RC oscillation is set as a reference oscillation frequency to thereby set a mechanism for detecting the difference between the reference oscillation frequency and the previous oscillation frequency.

Since the physical quantity sensor module 100 including a physical quantity sensor for measuring various physical quantities as described above also includes the reciprocal count value generation circuit 1 capable of generating a reciprocal count value with high accuracy, so that the physical quantity can be detected with high accuracy.

3 Structure Monitoring Device (SHM: Structural Health Monitoring)

Figure 10:
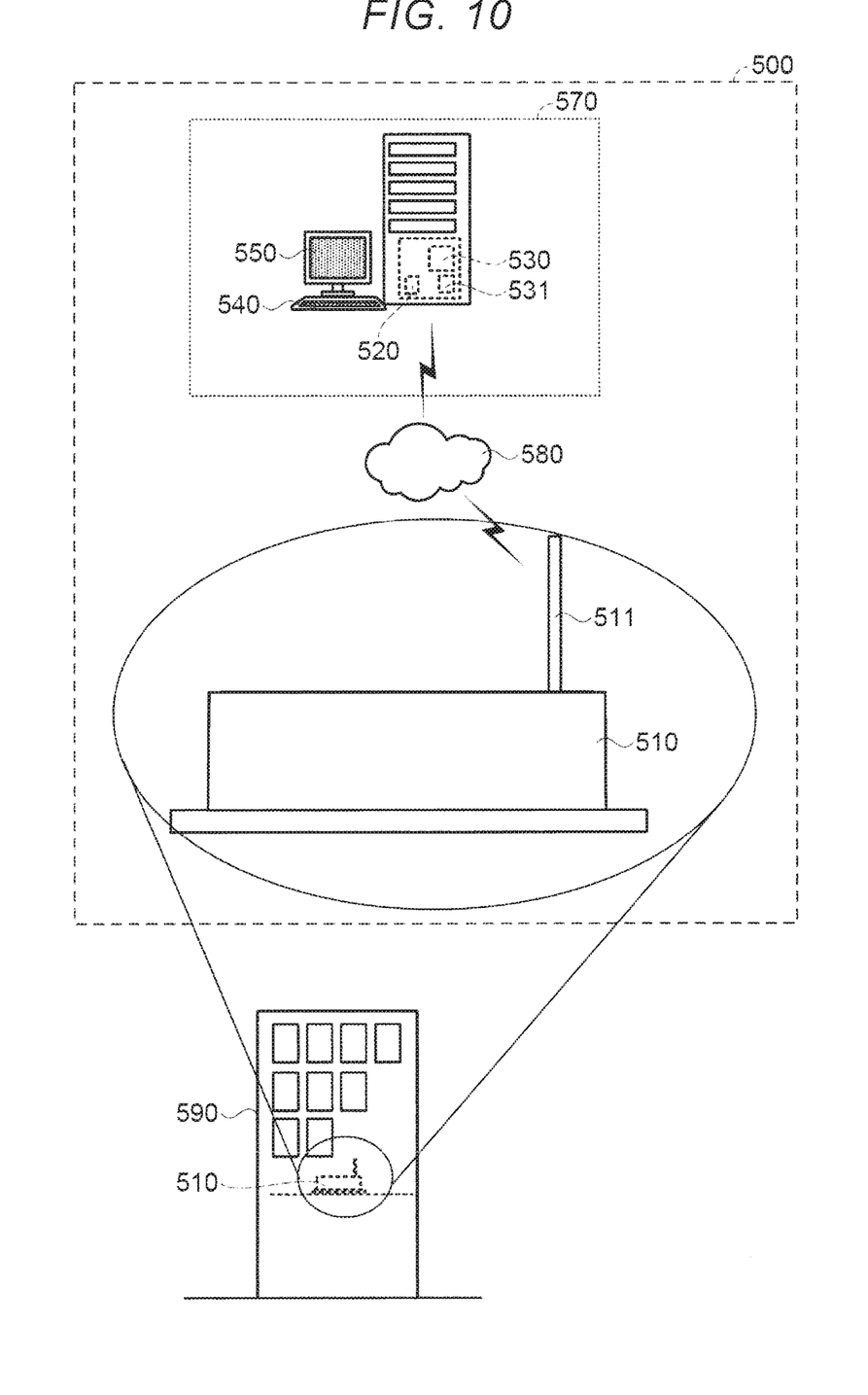
FIG. 10 is a configuration diagram illustrating a structure monitoring device according to the present embodiment.

FIG. 10 is a configuration diagram of a structural health monitoring (SHM) which is a structure monitoring device. As illustrated in FIG. 10, a structure monitoring device 500 according to this embodiment includes a physical quantity sensor module 510 having the same function as the physical quantity sensor module 100 of the embodiment described and attached to a structure 590 to be monitored. The physical quantity sensor module 510 includes a transmitter 511 that transmits a measurement signal. The transmitter 511 may be realized as a communication module and an antenna separate from the physical quantity sensor module 510.

The physical quantity sensor module 510 is coupled to a monitoring computer 570, for example, through a wireless or wired communication network 580. The monitoring computer 570 includes a receiver 520 coupled to the physical quantity sensor module 510 through the communication network 580 and a calculator 530 for calculating an inclination angle of the structure 590 based on a reception signal output from the receiver 520.

In this embodiment, the calculator 530 is realized by an application specific integrated circuit (ASIC), a field programmable gate array (FPGA) or the like mounted on the monitoring computer 570. However, a configuration in which the calculator 530 is realized by software by performing computation processing on a program stored in an IC memory 531 by a processor such as a central processing unit (CPU) may be adopted. The monitoring computer 570 can receive various operation inputs of the operator through a keyboard 540 and display the result of operation processing on a touch panel 550.

According to the structure monitoring device 500 of this embodiment, the inclination of the structure 590 is monitored using the physical quantity sensor module 510 having the same function as the physical quantity sensor module 100 of the embodiments described above. For that reason, it is possible to utilize highly accurate detection of the physical quantity (acceleration, angular velocity, and the like) which is an operational effect of the physical quantity sensor module 100, it is possible to accurately detect the inclination of the structure 590 to be monitored, and it is possible to improve the monitoring quality of the structure 590.

The present disclosure is not limited to the embodiment, and various modification can be made thereto within the scope of the gist of the present disclosure.

The embodiment and modification example described above are examples, and the present disclosure is not limited thereto. For example, it is also possible to combine each embodiment and each modification example as appropriate.

The present disclosure includes a configuration (for example, a configuration having the same function, method and result, or a configuration having the same object and effect) which is substantially the same as the configuration described in the embodiments. The present disclosure includes a configuration in which non-essential parts of the configuration described in the embodiment are replaced. Further, the present disclosure includes a configuration that achieves the same operation and effect as the configuration described in the embodiment, or a configuration that can achieve the same object. The present disclosure includes a configuration in which a publicly-known technique is added to the configuration described in the embodiment.

What is claimed is:

1. A count value generation circuit comprising:
a first counter that counts edges of a reference signal in synchronization with an input signal to generate a first count value;
a time digital value generator that generates a time digital value corresponding to a phase difference between the reference signal and the input signal;
a count integrated value combiner that outputs a difference between an integer multiple of the first count value and the time digital value; and
a count value generator that generates a count value based on a difference between a first output value and a second output value output from the count integrated value combiner.

2. The count value generation circuit according to claim 1,
wherein the time digital value generator includes
an oscillator,
a second counter that counts an output signal from the oscillator based on the reference signal and generates a second count value, and
a count value integrator that integrates the second count value to obtain an integrated value and outputs the integrated value as the time digital value.

3. The count value generation circuit according to claim 2,
wherein the number of times of oscillation in which the oscillator oscillates is equal to the integer.

4. The count value generation circuit according to claim 3,
wherein the oscillator stops oscillation when the oscillator oscillates by $2^n$ times, where n is a positive integer.

5. A physical quantity sensor module comprising:
the count value generation circuit according to claim 1; and
a physical quantity sensor that outputs the input signal.

6. The physical quantity sensor module according to claim 5,
wherein the physical quantity sensor measures any of mass, acceleration, angular velocity, angular acceleration, electrostatic capacitance, and temperature as a physical quantity.

7. A structure monitoring device comprising:
the physical quantity sensor module according to claim 5;
a receiver that receives a measurement signal from the physical quantity sensor module attached to a structure; and
a calculator that calculates an inclination angle of the structure based on a signal output from the receiver.

* * * * *